(12) United States Patent
Fjelstad

(10) Patent No.: US 6,809,608 B2
(45) Date of Patent: Oct. 26, 2004

(54) TRANSMISSION LINE STRUCTURE WITH AN AIR DIELECTRIC

(75) Inventor: Joseph Charles Fjelstad, Maple Valley, WA (US)

(73) Assignee: Silicon Pipe, Inc., San Jose, CA (US)

( * ) Notice: Subject to any disclaimer, the term of this patent is extended or adjusted under 35 U.S.C. 154(b) by 0 days.

(21) Appl. No.: 10/094,761

(22) Filed: Mar. 11, 2002

(65) Prior Publication Data

US 2003/0001698 A1 Jan. 2, 2003

Related U.S. Application Data

(60) Provisional application No. 60/347,776, filed on Jan. 11, 2002, and provisional application No. 60/298,679, filed on Jun. 15, 2001.

(51) Int. Cl.[7] .................................................. H01P 3/08
(52) U.S. Cl. ............................ 333/1; 333/238; 333/260
(58) Field of Search ................................. 333/238, 246, 333/260, 1; 174/117 AS

(56) References Cited

U.S. PATENT DOCUMENTS

| | | | |
|---|---|---|---|
| 2,984,802 A | 5/1961 | Dyer et al. | |
| 3,953,566 A | 4/1976 | Gore | 264/288 |
| 3,962,153 A | 6/1976 | Gore | 260/2.5 R |
| 4,096,227 A | 6/1978 | Gore | 264/210 R |
| 4,187,390 A | 2/1980 | Gore | 174/102 R |
| 4,443,657 A | 4/1984 | Hill et al. | 174/110 FC |
| 4,680,423 A | 7/1987 | Bennett et al. | 174/36 |
| 4,701,576 A | 10/1987 | Wada et al. | 174/117 F |
| 4,730,088 A | 3/1988 | Suzuki | 174/102 R |
| 4,755,911 A | 7/1988 | Suzuki | |
| 4,902,423 A | 2/1990 | Bacino | 210/500.36 |
| 4,939,317 A | 7/1990 | Hostler | 174/107 |
| 5,110,998 A | 5/1992 | Muschiatti | 174/24 |
| 5,158,820 A | * 10/1992 | Scammell | 428/138 |
| 5,194,020 A | 3/1993 | Voltz | 439/579 |
| 5,227,742 A | * 7/1993 | Suzuki | 333/1 |
| 5,286,924 A | 2/1994 | Loder et al. | 174/117 F |
| 5,689,216 A | * 11/1997 | Sturdivant | 333/260 X |
| 5,724,012 A | 3/1998 | Teunisse | |
| 5,744,756 A | 4/1998 | Springer et al. | 174/110 N |
| 6,559,377 B1 | 5/2003 | Noda et al. | |

FOREIGN PATENT DOCUMENTS

| | | |
|---|---|---|
| EP | 0 402 052 A2 | 12/1990 |
| EP | 0 402 053 A2 | 12/1990 |
| EP | 0 498 677 A2 | 12/1992 |
| GB | 886 311 A | 1/1962 |
| JP | 6-334410 | 12/1994 |

* cited by examiner

Primary Examiner—Benny Lee
(74) Attorney, Agent, or Firm—Shemwell Gregory & Courtney LLP

(57) ABSTRACT

The dielectric constant and loss tangent of a transmission structure is lowered by sandwiching a conductor between two dielectric structures one or both of which have a series of openings. The conductor is formed so that the conductor is formed across each opening of each dielectric structure. The dielectric structures provide structural support while exposing a significant portion of the conductor to air, thereby forming a transmission structure with an largely air-dielectric.

39 Claims, 9 Drawing Sheets

TRANSMISSION LINE STRUCTURE WITH AN AIR DIELECTRIC

RELATED APPLICATIONS

The present application claims priority from U.S. Provisional Application No. 60/298,679 filed on Jun. 15, 2001 for Ultra Low Loss, Low Dielectric Constant Conductor Constructions for Carrying Electrical/Electronic Signals and Methods for their Manufacture by Joseph Charles Fjelstad. The present application also claims priority from U.S. Provisional Application No. 60/347,776 filed on Jan. 11, 2002 for High Performance Signal Layers for Backplane and Related Constructions and Methods for their Manufacture by Joseph Charles Fjelstad.

BACKGROUND OF THE INVENTION

1. Field of the Invention

The present invention relates to a transmission structure and, more particularly, to a transmission structure with an air dielectric.

2. Description of the Related Art.

In the field of electronics, one of the critical issues is the loss of signal strength as it is transmitted from device to device or system to system. In early circuit designs, this was not so great a concern because the signal speeds were relatively slow and were transmitted directly through copper or other metal conductors.

As a result, the dielectric constant and loss tangent of the substrate and coating materials were not critical. The dielectric constant (permittivity) is the amount of electrical energy stored in an insulator when an electrical field is imposed across it. The dielectric constant is expressed in terms of a ratio to that in a vacuum. A lower dielectric constant (Dk) allows faster conductor signal speed as well as thinner interconnects for the same conductor geometries.

The loss tangent (dissipation factor) is the degree of dielectric loss, and is expressed in terms of a ratio of the real-number and imaginary-number portion of a complex dielectric constant. A lower dissipation factor (Df) allows for improved signal integrity with high frequencies and less signal loss at high frequencies.

However, at higher frequencies, the dielectric constant and loss tangent of the substrate and coating materials used in combination with the conductors are critical. The higher frequency signals propagate along the surface of the metal conductor, and are therefore impeded and degraded by the electrical properties (i.e. dielectric constant and loss tangent) of the dielectric materials that are adjacent to the conductor. There are also concerns about parasitic loss of signal due to build-up of capacitance in the substrate.

As a result, many attempts have been made to produce electronic materials and structures that are capable of serving the needs of high-speed signal transmission both in substrates and in interconnection cables with minimum signal distortion.

The conductor's attenuation is determined by dielectric losses and by frequency-dependent AC losses (skin effect in copper conductors). At high speeds, the skin effect contributes decisively to the overall loss and leads to a reduction in signal amplitude. The skin-effect can be counteracted by increased track width and thicker copper lines.

One way to mitigate the problem is to define, create and/or use materials having ever better dielectric/electrical properties such as lower dielectric constant (Dk) and loss tangent. Among the best materials yet discovered for this purpose are materials found in the family of fluoropolymers such as E. I. Du Pont's TEFLON® (also known as polytetrafluoroethylene (PTFE)).

These materials have dielectric constants in the range of 2.0–2.8. Other materials such as polypropylene have even lower dielectric constants, however, they have other properties such as strength and temperature limitations that make them less desirable for electronics manufacture. Table 1 provides a list of some of the materials that have been used alone or in combination in the manufacture of electronic circuits.

TABLE 1

| Dielectric Material | Dielectric Constant |
|---|---|
| Air | 1 |
| Polypropylene | 1.5 |
| TEFLON ®, PTFE | 2.0 |
| TEFLON ®, FEP | 2.1 |
| Polyethylene | 2.2–2.4 |
| TEFLON ®, PCTFE | 2.3–2.8 |
| Rubber (isomerized) | 2.4–3.7 |
| Styrene (modified) | 2.4–3.8 |
| Bisbenzocyclobutene | 2.5 |
| Polyamide | 2.5–2.6 |
| Polyimide | 2.8 |
| Polyester resin | 2.8–4.5 |
| Polycarbonate | 2.9–3.0 |
| Silicone rubber | 3.2–9.8 |
| Epoxy resin (cast) | 3.6 |
| Polyester resin (glass fiber filled) | 4.0–4.5 |
| Polyester resin (flexible) | 4.1–5.2 |
| Silicon dioxide | 4.5 |
| Phenol resin | 4.9 |
| Alumina | 9.3–11.5 |
| Silicon | 11.0–12.0 |

In the realm of high-speed transmission line cables, coaxial cables have seen the greatest use. However, as computer processing speeds have increased, there is now a need for next generation cables which can handle the increased data transmission requirements of shorter rise times while maintaining low noise and crosstalk.

Typically, to protect signal integrity and to control signal line impedance, signal transmission cables are commonly provided with a conductive shield of metal foils, braided wire or the like. This also serves to prevent electromagnetic interference (EMI) from radiating into and out from the cable. Pleated foil cables are an example of a shielded cable and represent one attempt to approximate the performance of conventional high-speed coaxial cables while allowing mass termination of the signals though use of specially developed connectors.

Electronic conductor assemblies such as ribbon cable, coaxial cables and printed circuit boards have been insulated using a wide variety of different materials over time. Those having low dielectric constants and attenuation properties have proven most attractive for high speed signal processing.

Examples of such materials include polytetrafluoroethylene, polypropylene, polyethylene and fluoroethylpropylene. Values for these materials can be seen in Table 1. Originally these materials were used in solid form. However, as can be seen in Table 1, the best value is that of air, which is 1.0. (A vacuum is theoretically best but in practice is only marginally better than air.) Thus to improve the performance of some of these materials, air began to be included in the dielectric by foaming them with air.

A variety of methods have been used to foam insulating materials with air. These are described in U.S. Pat. Nos. 4,680,423 and 5,110,998. Although this helps to lower the effective dielectric constant of the material, the surfaces remain largely Intact, and thus loss at the surface is not greatly improved. U.S. Pat. No. 4,939,317 also describes a round conductor wrapped in perforated polyimide tape to lower the effective dielectric constant of the material without resorting to more exotic materials.

An early approach to taking advantage of the dielectric properties of air is to spirally wrap a conductor wire with one or more strands of polymer, effectively holding them uniformly away from a circumferential ground reference. This is most suitable for round wire and cable constructions such as coaxial cables. While contact between the polymer strands and the conductor is greatly minimized, (reducing skin effect loss), the number of conductors that can be effectively handled is minimal.

U.S. Pat. Nos. 3,953,566 and 4,730,088 disclose the use of polytetrafluroethylene (PTFE) as a dielectric. However, the material is expensive and difficult to process in comparison to more commonly used dielectric materials. It remains attractive for its performance capability but it also has limits in high performance applications. To improve on the performance of the material, U.S. Pat. No. 4,730,088 describes how holes can be drilled into such materials by use of heat rays, particle rays or laser drilling. In addition, U.S. Pat. Nos. 4,443,657 and 4,701,576 describe the use of sintering. In each case, however, the suggested methods only add processing costs to the expense of the material.

Porous expanded polytetrafluoroethylene material can be created by methods disclosed in U.S. Pat. Nos. 3,953,566, 3,962,153, 4,096,227, 4,187,390, and 4,902,423. Such material may also serve as improved low dielectric constant materials suitable for electronics applications.

Still other attempts have been made to create materials that provide still lower dielectric constants and loss tangents. U.S. Pat. No. 5,286,924, for example, describes a cable construction utilizing an insulator consisting of a cellular construction of porous polypropylene. The porous dielectric as manufactured has an air equivalent volume in excess of 70% and a dielectric constant of less than 1.2.

This translates to a material that has a signal propagation velocity of the insulated conductor of approximately 85% of the propagation velocity in air. Although these dielectric materials exhibit excellent electrical properties when used as cable dielectrics, the process used in their manufacture is complex and they are thus expensive to produce.

The pursuit of low loss, low dielectric constant materials is unending and continues to the present time. U.S. Pat. No. 5,744,756 describes a high-speed signal transmission cable with spaced, parallel conductors having an insulation layer comprised of a blown microfiber web surrounding the conductors to lower the dielectric constant of the material.

While all of the efforts to date have made improvements in the state of the art, there has remained room for improvement.

SUMMARY OF THE INVENTION

The present invention provides a transmission structure with a reduced the dielectric constant and loss tangent. A transmission structure in accordance with the present invention includes a first dielectric support that has a number of spaced-apart first openings, and a conductor that contacts the first dielectric support such that the conductor is formed across each first opening. The transmission structure also includes a second dielectric support that has a number of spaced-apart second openings. The second dielectric support contacts the conductor such that the conductor is formed across each second opening.

The present invention also includes a method of forming a transmission structure. The method includes the step of laminating a first dielectric support to a first shield and a layer of conductive material. The first dielectric support has a number of spaced-apart first openings. The method also includes the steps of selectively removing the layer of conductive material to form a plurality of conductors on the first dielectric support over the first openings.

The method of the present invention can also include the step of laminating a second dielectric support to the plurality of conductors. The second dielectric support has a plurality of spaced-apart second openings. The method can further include the step of laminating a second shield to the second dielectric support.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

The present invention is illustrated by way of example in the figures of the accompanying drawings in which like reference numerals refer to similar elements and in which:

FIG. 1A is a separated layer view, while FIG. 1B is an exploded view. FIG. 1C is a cut-away plan view, FIG. 1D is a cross-sectional view of a first embodiment taken along line 1D—1D in FIG. 1C, and FIG. 1E is a cross-sectional view of a second embodiment taken along line 1D—1D in FIG. 1C.

FIGS. 2A–2D are perspective views illustrating a first part of the method of forming the air dielectric transmission structure in accordance with the present invention. FIGS. 2E–2I are cross-sectional views illustrating a second part of the method of forming the air dielectric transmission structure in accordance with the present invention.

FIG. 3A is a cross-sectional view illustrating an air dielectric transmission structure in accordance with an alternate embodiment of the present invention. FIG. 3B is a cross-sectional view illustrating an air dielectric transmission structure in accordance with another alternate embodiment of the present invention. FIG. 3C is a cross-sectional view illustrating an air dielectric transmission structure in accordance with another alternate embodiment of the present invention. FIG. 3D is a cross-sectional view illustrating an air dielectric transmission structure in accordance with another alternate embodiment of the present invention.

FIG. 4A is a perspective view illustrating an embodiment of a back plane. FIG. 4B is a close-up view illustrating a portion of the back plane of FIG. 4A. FIG. 4C is a perspective view further illustrating the back plane of FIG. 4A. FIG. 4D is a perspective view illustrating an alternate embodiment of a back plane of FIGS. 4A–4C. FIG.

Figures 4A, 4B:
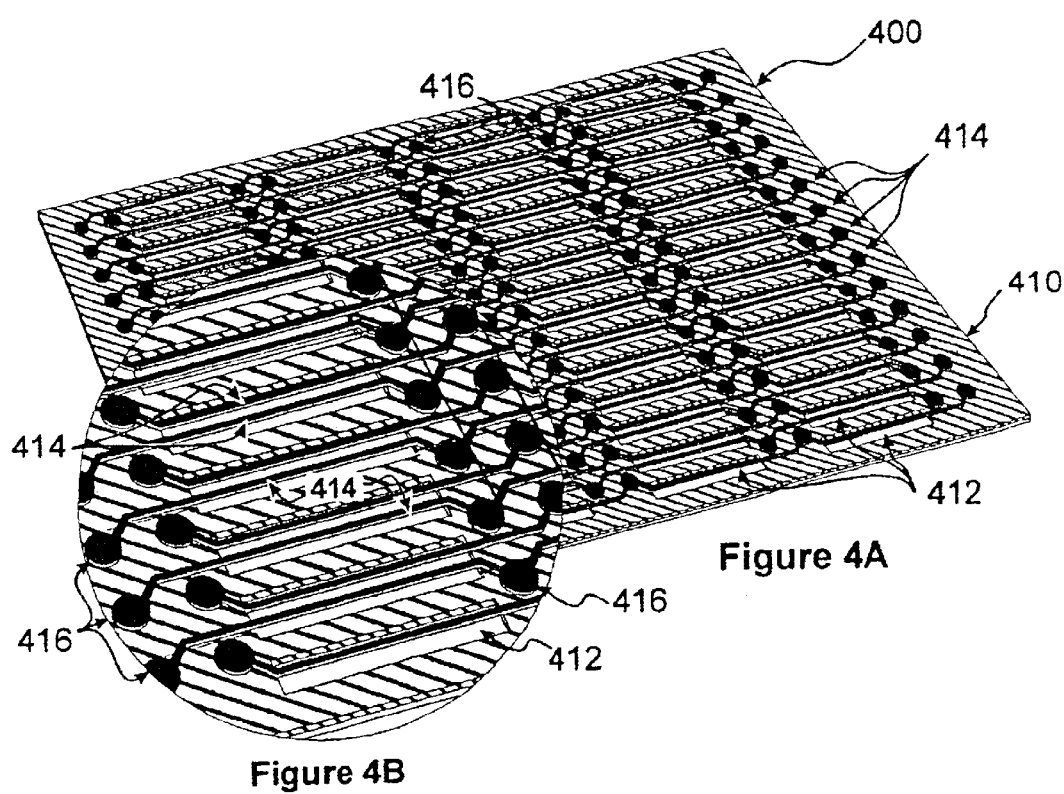
FIGS. 4A–4E are perspective views illustrating embodiments of a back plane in accordance with the present invention.
Figure 4C:
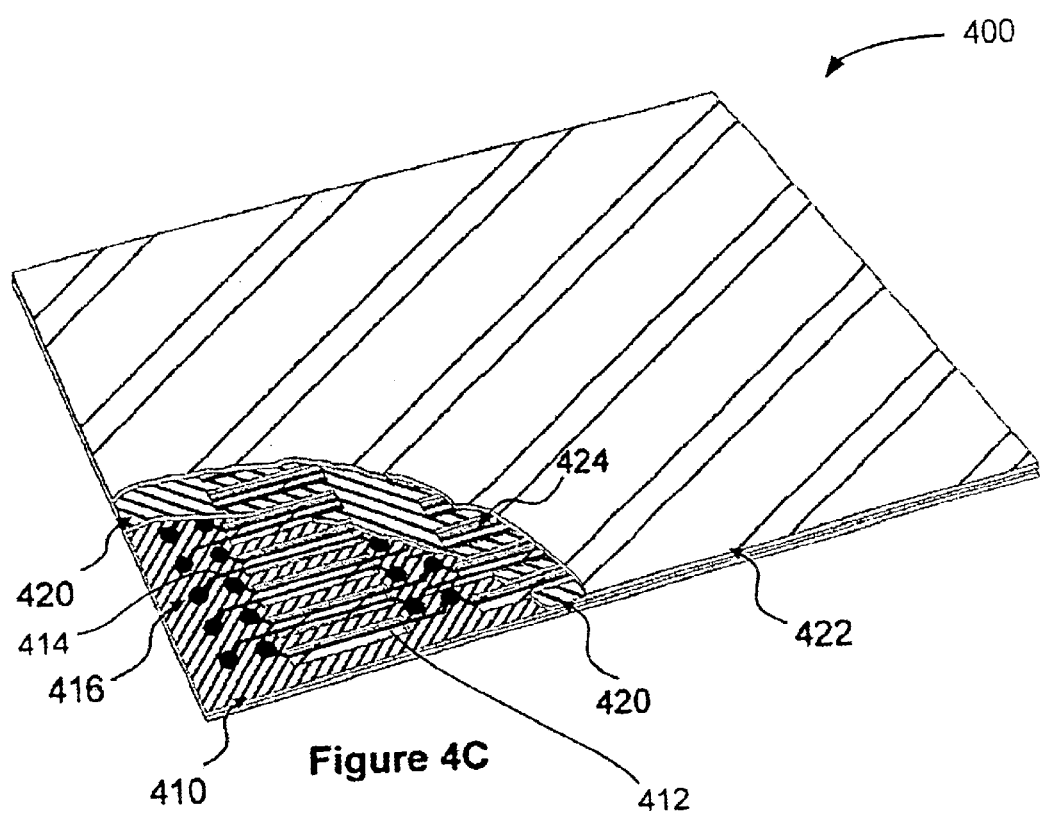
Figure 4D:
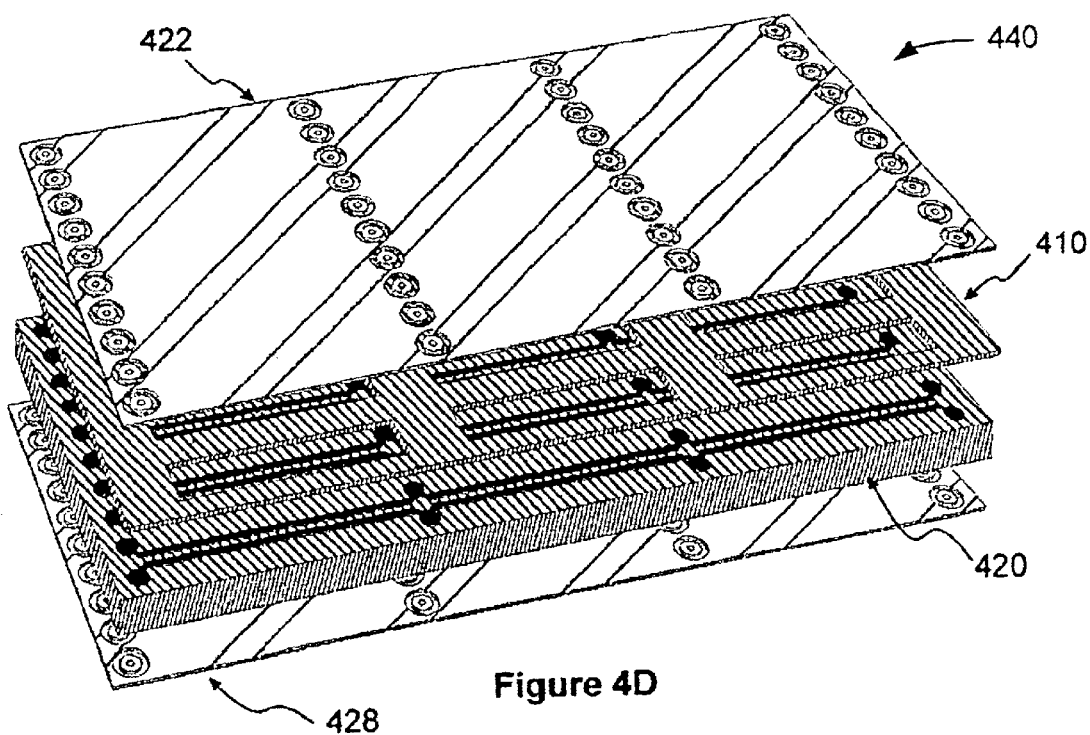

4E is a cross-sectional perspective view illustrating the back plane of FIG. 4D.

Figure 5:
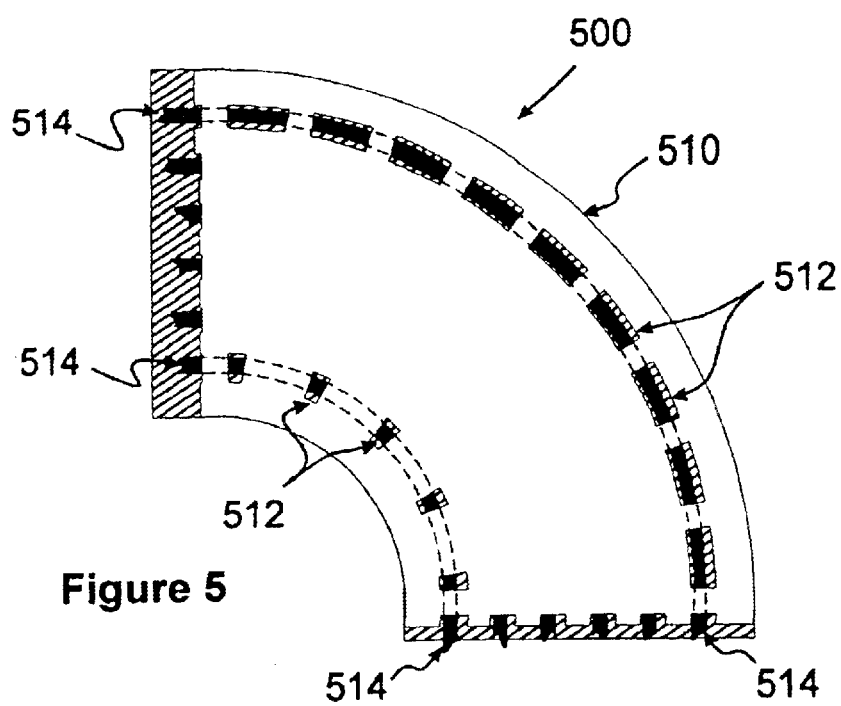

FIG. 5 is a plan view illustrating a curved section of an air dielectric transmission system in accordance with the present invention.

Figure 6:
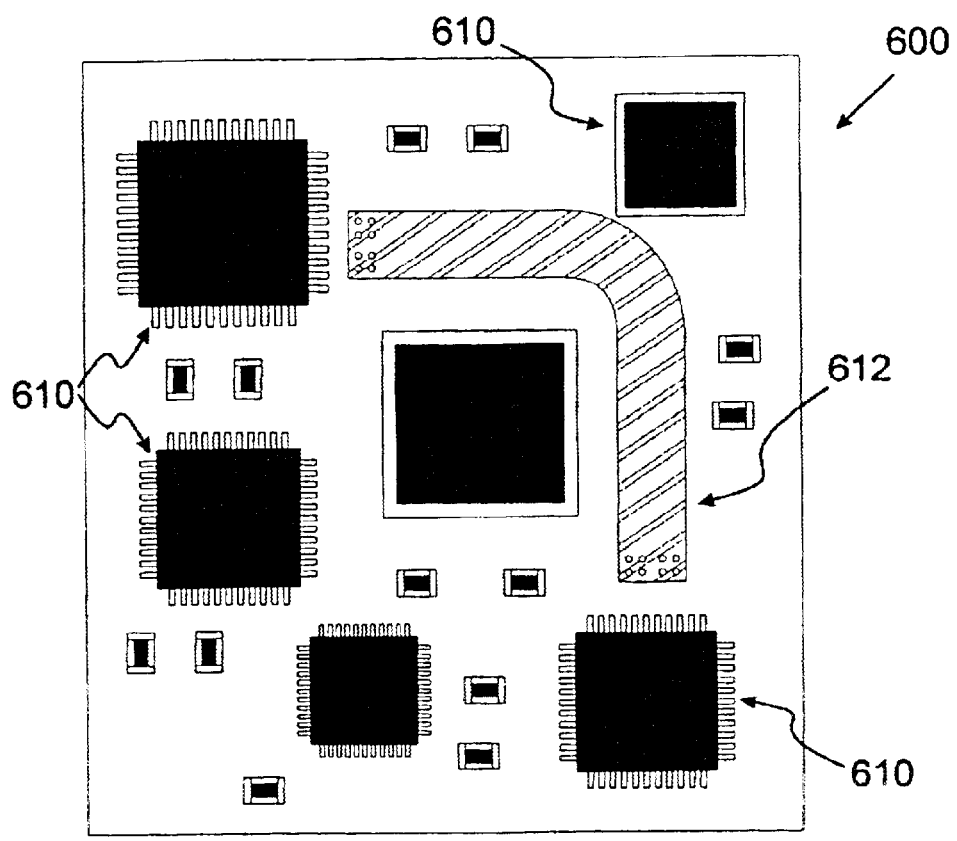

FIG. 6 is a plan view illustrating a printed circuit board in accordance with the present invention.

Figure 7A:
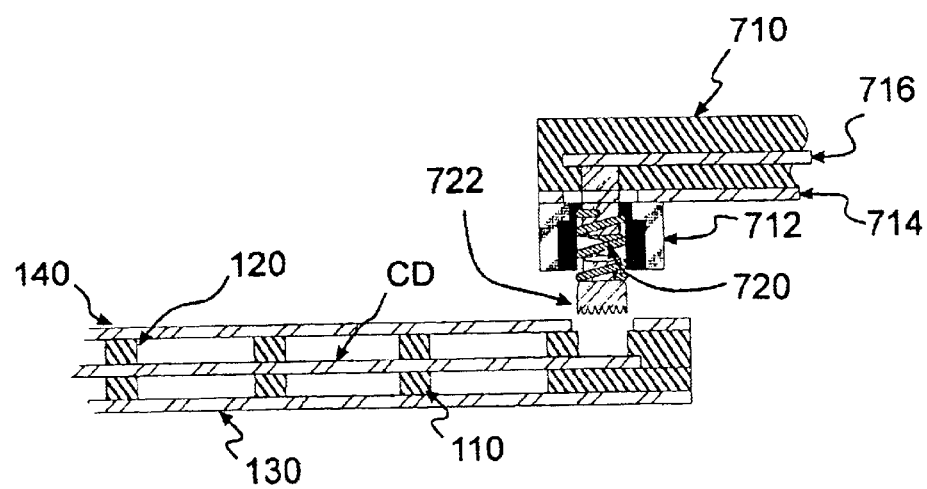
Figure 7B:
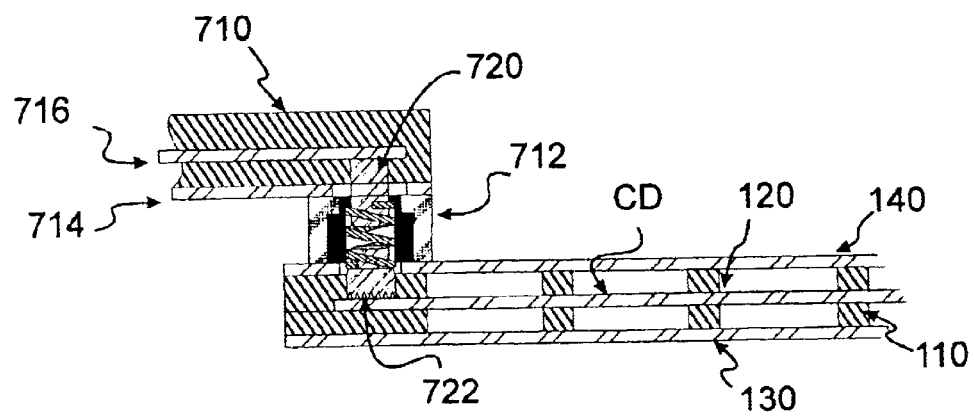

FIGS. 7A–7B are cross-sectional views illustrating an example of a connector in accordance with the present invention.

DETAILED DESCRIPTION OF THE INVENTION

Figure 1A:
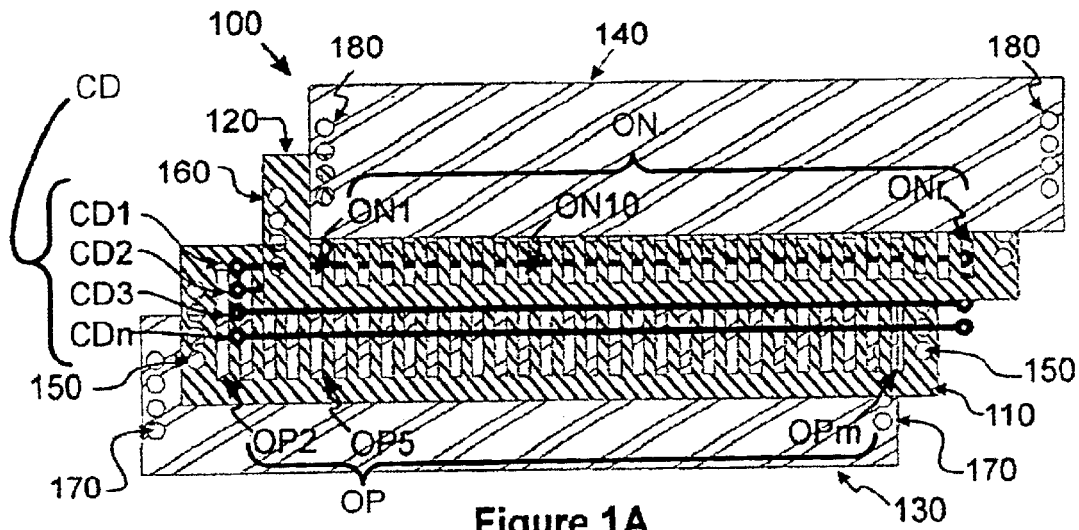
FIGS. 1A–1E are a series of views illustrating an air dielectric transmission structure in accordance with the present invention.
Figure 1B:
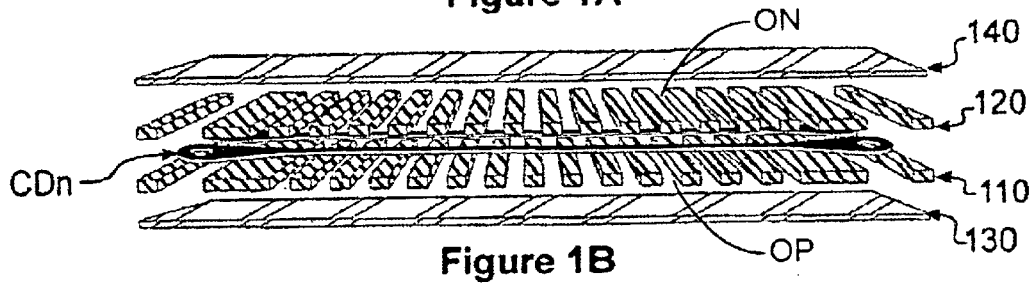
Figure 1C:
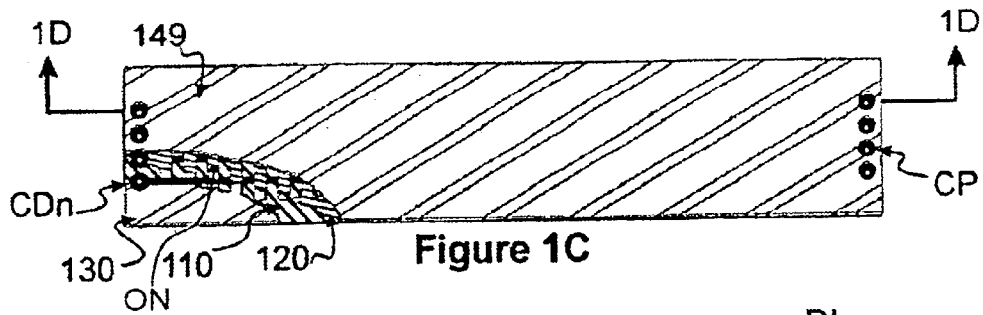
Figure 1D:
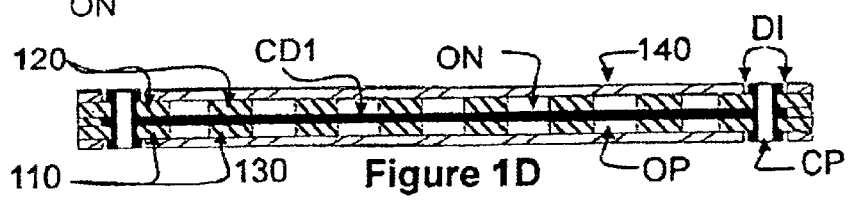
Figure 1E:
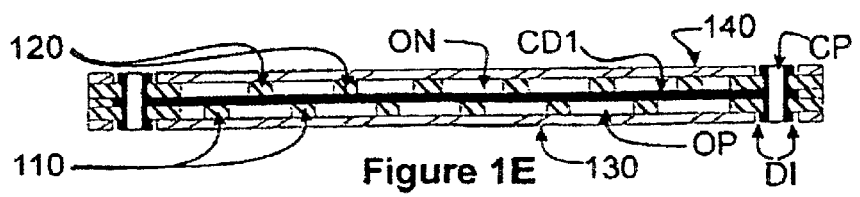

FIGS. 1A–1E show a series of views that illustrate an air dielectric transmission structure 100 in accordance with the present invention. FIG. 1A shows a separated layer view, while FIG. 1B shows an exploded view. FIG. 1C shows a cut-away plan view, FIG. 1D shows a cross-sectional view of a first embodiment taken along line 1D—1D in FIG. 1C, and FIG. 1E shows a cross-sectional view of a second embodiment taken along line 1D—1D in FIG. 1C.

As shown in FIGS. 1A–1E, air dielectric transmission structure 100 includes a dielectric support 110 that has a series of spaced-apart openings OP (enumerated in FIG. 1A as OP1, . . . , OP5, . . . -OPm), and a series of conductors CD (enumerated in FIG. 1A as CD1, CD2, CD3 , . . . , -CDn) that contact dielectric support 110. Conductors CD1-CDn are arranged in parallel (when more than one conductor is present), and contact dielectric support 110 such that each conductor CD is formed over each opening OP.

In the example shown in FIGS. 1A–1E, the length of an opening OP is a function of the number of conductors CD to be used, with length increasing with the number of conductors CD. The width of the opening OP is as wide as possible, limited by the need to maintain the structural integrity of the conductors CD without gravity induced deformation or sag, and the tensile strength and other requirements of transmission structure 100. (The width of the opening can alternately be shorter than the widest possible width.)

As further shown in FIGS. 1A–1E, air dielectric transmission structure 100 also includes a dielectric support 120 that has a series of spaced-apart openings ON (enumerated in FIG. 1A as ON1, . . . , ON10, . . . -ONr). Dielectric support 120 also contacts conductors CD1-CDn such that each conductor CD is formed over each opening ON. As a result, conductors CD1-CDn are sandwiched between dielectric supports 110 and 120. To reduce capacitive losses, conductors can be narrowed as they cross over dielectric supports.

In one embodiment, dielectric supports 110 and 120 are identical, and contact conductors CD1-CDn such that openings OP1-OPm and ON1-ONr are substantially in register with each other. As a result, as shown in FIG. 1D, openings OP and ON are vertically aligned with each other. In a second embodiment, as shown in FIG. 1E, openings OP and ON in dielectric supports 110 and 120, respectively, are vertically offset from each other.

In addition, air dielectric transmission structure 100 includes a first shield 130 that is connected to dielectric support 110, and a second shield 140 that is connected to dielectric support 120. Shields 130 and 140 are both spaced apart from conductors CD1-CDn by the thicknesses of dielectric supports 110 and 120, and provide a ground reference.

In the example shown in FIG. 1A, external connections to conductors CD1-CDn are made by forming dielectric supports 110 and 120 to have contact openings 150 and 160, respectively, that are vertically aligned with each other when contacting conductors CD1-CDn, regardless of the alignment of openings OP and ON.

Further, shields 130 and 140 are formed to have contact openings 170 and 180, respectively shown in FIG. 1A, which have vertical centerlines that are vertically aligned with the vertical centerlines of contact openings 150 and 160. In addition, as shown in FIGS. 1C, 1D and 1E, air dielectric transmission structure 100 includes a number of connector plugs CP (e.g., plated through holes) that are formed in contact with the openings 150, 160, 170, and 180 illustrated in FIG. 1A. Referring to FIGS. 1C, 1D and 1E, connector plugs CP make electrical connections with conductors CD1-CDn, and are spaced apart from shields 130 and 140 via dielectric openings DI (which prevent shorting to ground and can be filled with a dielectric material, as shown in FIG. 1D).

Air dielectric transmission structure 100 can additionally include a plastic jacket (not shown) that is formed around shields 130 and 140 to protect shields 130 and 140 from corrosive or other environmental effects and physical damage. Other materials can be added between shields 130 and 140 and the plastic jacket to provide structure 100 with a particular cross-sectional shape, such as circular if desired.

FIGS. 2A–2I show a series of views that illustrate a method of forming an air dielectric transmission structure 200 in accordance with the present invention. FIGS. 2A–2D show perspective views that illustrate a first part of the method of forming structure 200 in accordance with the present invention. FIGS. 2E–2I show cross-sectional views that illustrate a second part of the method of forming structure 200 in accordance with the present invention.

Figure 2A:
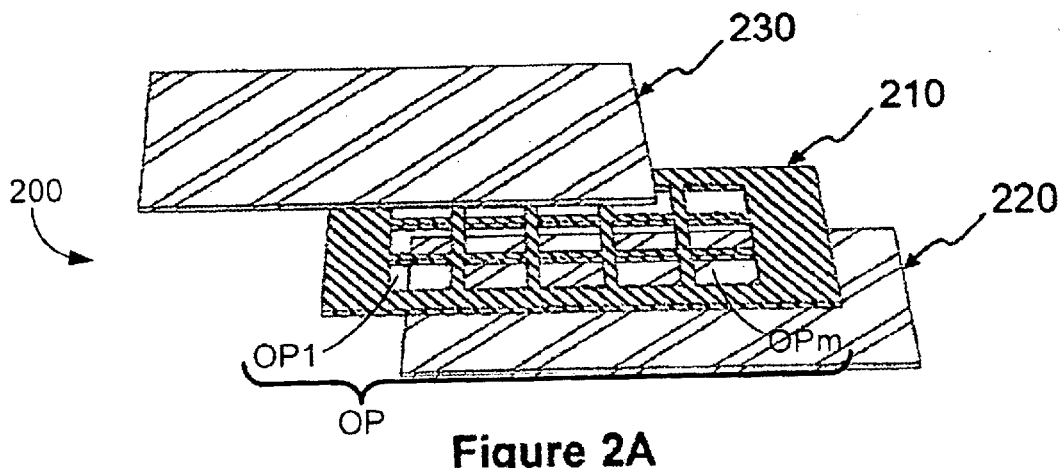
FIGS. 2A–2I are a series of views illustrating a method of forming an air dielectric transmission structure in accordance with the present invention.

As shown in FIG. 2A, the method utilizes a dielectric support 210 that has a series of spaced-apart openings OP (enumerated as OP1-OPm), a conductive shield 220, and a layer of conductive material 230. In the example shown in FIGS. 2A–2H, the length of an opening OP is a function of the number of to-be-formed conductors, with length increasing with the number of conductors.

The width of the opening OP is as wide as possible, limited by the need to maintain the structural integrity of the to-be-formed conductors without gravity induced deformation or sag, and the tensile strength and other requirements of transmission structure 200. (The width of the opening can alternately be shorter than the widest possible width.)

Dielectric support 210 is formed using conventional processes and materials. For example, a polymer film in a roll or sheet can be perforated to form openings OP. Although materials with a low dielectric constant are preferred electrically, the influence of support 210 is relatively small. As a result, higher dielectric materials can also be used to form dielectric support 210.

As shown in FIG. 2A, the method begins by laminating together dielectric support 210, conductive shield 220, which can be implemented with, for example, a sheet of copper foil, and conductive layer 230 such that dielectric support 210 is sandwiched between shield 220 and conductive layer 230.

Figure 2B:
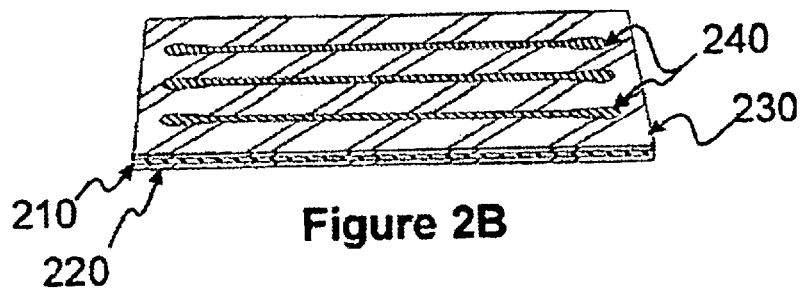
Figure 2C:
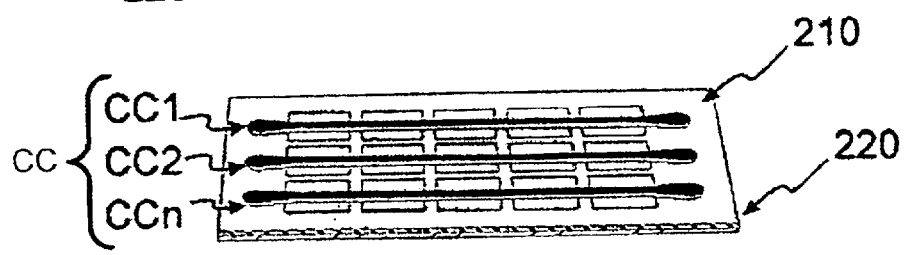

Following this, as shown in FIG. 2B, a conductor mask 240 is formed and patterned on conductor layer 230. Next, as shown in FIG. 2C, conductive layer 230 is etched away to form a series of conductors CC (enumerated as CC1, CC2, . . . , -CCr), such as CD1-CDn of FIG. 1A, on dielectric support 210. After the etch, mask 240 (FIG. 2B) is removed.

Figure 2D:
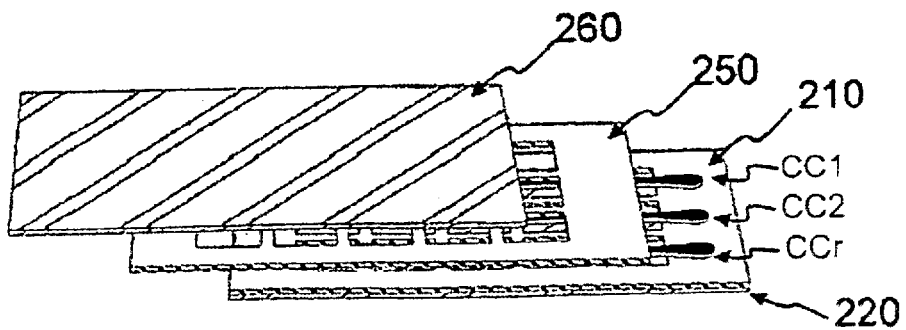

As shown in FIG. 2D, once mask 240 has been removed, a dielectric support 250 and a shield 260 are laminated together and to conductors CC1-CCr. Dielectric support 250 and shield 260 are conventionally prepared in a manner like dielectric support 210 and shield 220.

Figure 2E:
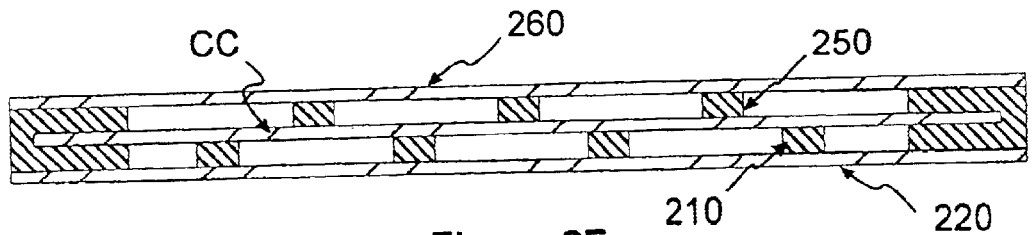

As shown in FIG. 2E, once laminated together, conductors CC are spaced apart from shields 220 and 260 by the thicknesses of dielectric supports 210 and 250, respectively. (The air pressure in openings OP can be at any pressure provided it does not distort the structure and alter the electronic performance.)

Figure 2F:
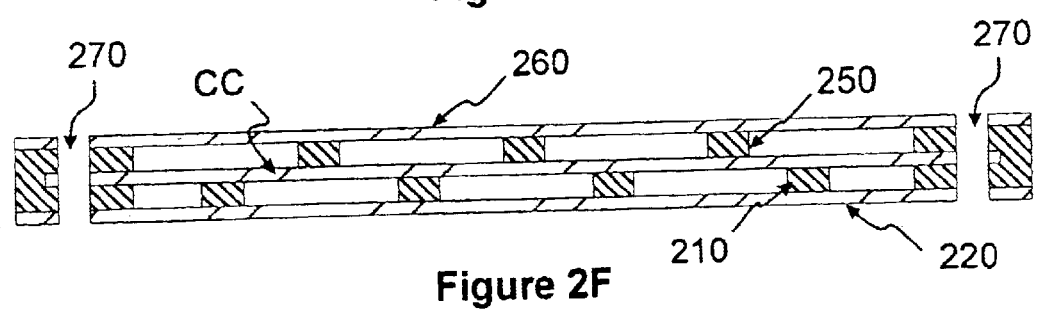

Following this, as shown in FIG. 2F, openings 270 are formed through shield 260, dielectric support 250, conductors CC, dielectric support 210, and shield 220. Openings 270 can be formed in any of a number of conventional ways, including masking and etching, micro-machining, and drilling. (Alternately, openings 270 can only extend down to and expose conductors CC.)

Figure 2G:
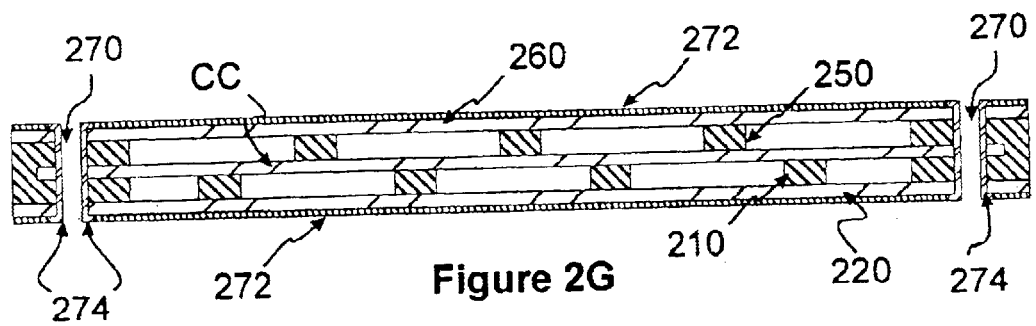

Next, as shown in FIG. 2G, a layer of masking material is formed and patterned on shields 220 and 260 to form a mask layer 272 that exposes openings 270. Openings 270 are then plated (or filled) using conventional techniques to form conductive plugs (e.g., plated through holes) 274. After conductive plugs 274 have been formed, mask layer 272 is removed.

Figure 2H:
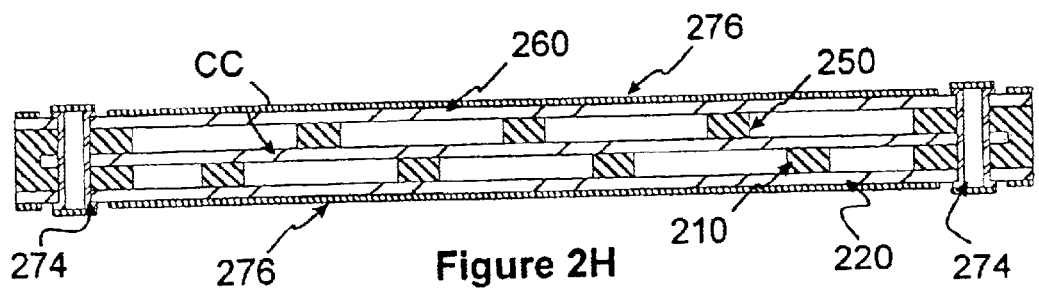
Figure 2I:
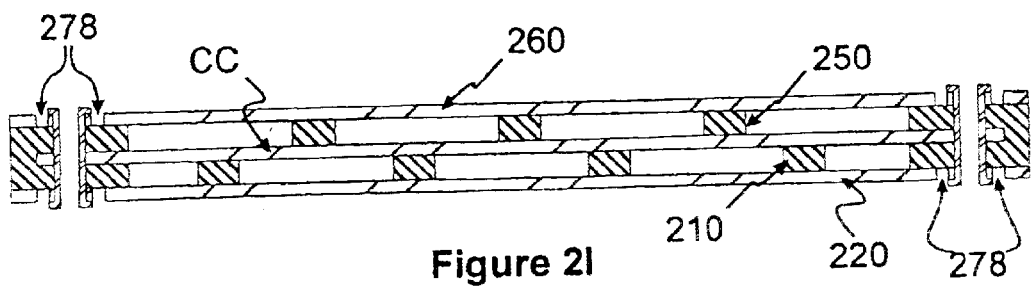

Following this, as shown in FIG. 2H, a layer of masking material is formed and patterned on shields 220 and 260 to form a mask layer 276 that protects plugs 274, and exposes a region of shield 220 and a region of shield 260 around plugs 274. Next, as shown in FIG. 2I, the exposed regions of shields 220 and 260 are removed to thereby electrically isolate plugs 274 from shields 220 and 260 with a gap 278. Following this, mask layer 276 (FIG. 2H) is removed.

For larger cabling applications, there is no need to mask and etch a layer of conductive material to form conductors CC. In this case, metal wires are sandwiched between dielectric supports 210 and 250 using lamination or other conventional processes for forming a multi-layer structure. The metal wires can be, for example, flat or round.

Figure 3A:
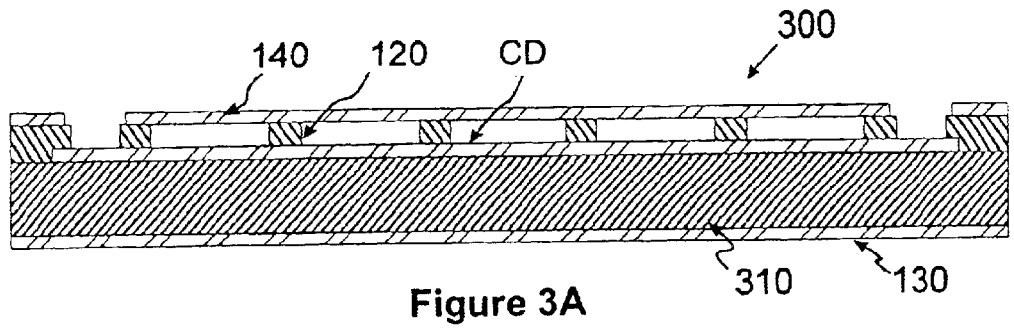
FIGS. 3A–3D are cross-sectional views illustrating alternate embodiments of the present invention.

FIGS. 3A–3D show cross-sectional views that illustrate alternate embodiments of the present invention. FIG. 3A shows a cross-sectional view that illustrates an air dielectric transmission structure 300 in accordance with an alternate embodiment of the present invention. Structure 300 is similar to structure 100 and, as a result, utilizes the same reference numerals to designate the elements that are common to both structures.

As shown in FIG. 3A, structure 300 differs from structure 100 in that structure 300 utilizes a solid dielectric layer 310 in lieu of dielectric layer 110. In structure 300, air is used as a dielectric on only one side of the structure. Such structures are suitable for mid-range frequencies.

Figure 3B:
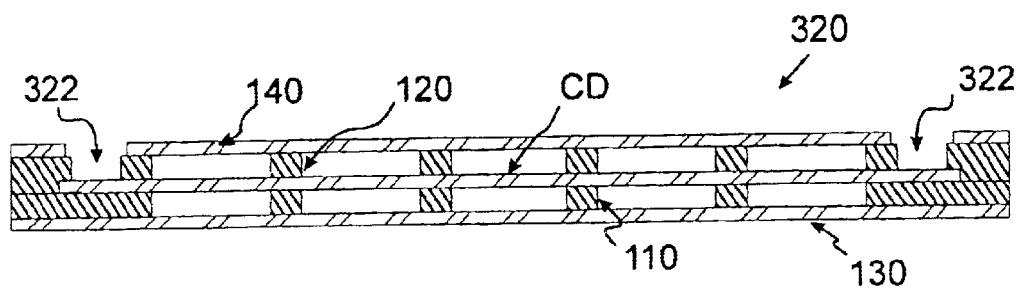

FIG. 3B shows a cross-sectional view that illustrates an air dielectric transmission structure 320 in accordance with an alternate embodiment of the present invention. Structure 320 Is similar to structure 100 and, as a result, utilizes the same reference numerals to designate the elements that are common to both structures.

As shown in FIG. 3B, structure 320 differs from structure 100 in that structure 320 has a connector opening 322 formed through dielectric layer 120 to expose the conductors CD, but no corresponding opening formed through dielectric layer 110. As shown, the width of the opening through shield 140 can be wider than the width of the opening through dielectric layer 120.

Figure 3C:
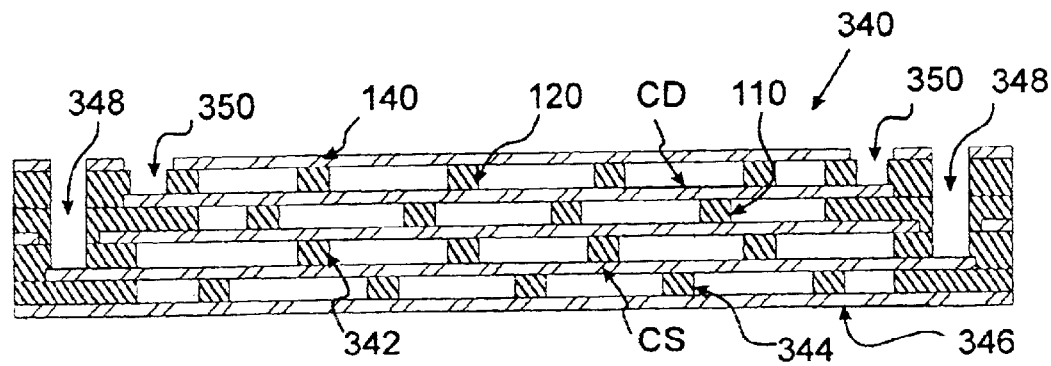

FIG. 3C shows a cross-sectional view that illustrates an air dielectric transmission structure 340 in accordance with an alternate embodiment of the present invention. Structure 340 is similar to structure 100 and, as a result, utilizes the same reference numerals to designate the elements that are common to both structures.

As shown in FIG. 3C, structure 340 differs from structure 100 in that structure 340 has a third dielectric structure 342 connected to first shield 130, and spaced-apart conductors CS that are connected to third dielectric structure 342. In addition, structure 340 also has a fourth dielectric structure 344 connected to conductors CS, and a third shield 346 connected to fourth dielectric structure 344. Dielectric structures 342 and 344 are similar to dielectric structures 110 and 120, and conductors CS are similar to conductors CD.

Thus, structure 340 provides an example of multiple layers of conductors (more than two layers of conductors can also be used). Further, a first connector opening 348 to conductors CS can be formed through dielectric structures 110, 120, and 342 as shown in FIG. 3C, or can be formed through shield 346 and dielectric structure 344. Structure 340 also has a second connector opening 350 formed through dielectric layer 120 to expose the conductors CD. (In both cases, the widths of the openings 348 and 350 through the metal shield can be wider than the width of the opening through the dielectric structure.)

Figure 3D:
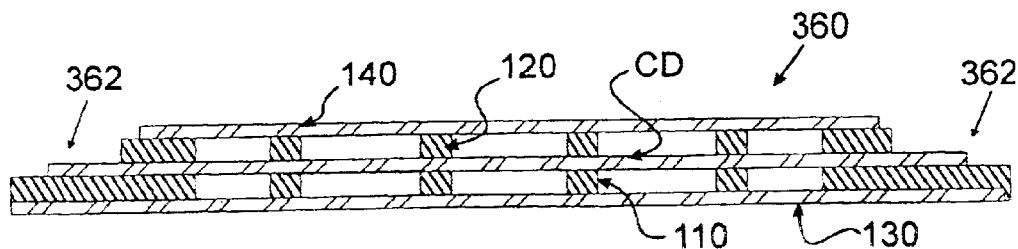

FIG. 3D shows a cross-sectional view that illustrates an air dielectric transmission structure 360 in accordance with an alternate embodiment of the present invention. Structure 360 is similar to structure 100 and, as a result, utilizes the same reference numerals to designate the elements that are common to both structures.

As shown in FIG. 3D, structure 360 differs from structure 100 in that structure 360 has stair-step ends 362. As shown in FIG. 3D, the end section of dielectric support 120 and shield 140 have been removed to expose a section of conductors CD. In addition, as shown in FIG. 3D, a smaller end section of conductors CD can also be removed.

In addition to transmission structures 100, 200, 300, 320, 340, and 360, the present invention can also be utilized to form high speed back planes. FIGS. 4A–4E show perspective views that illustrate embodiments of a back plane in accordance with the present invention.

Figure 4E:
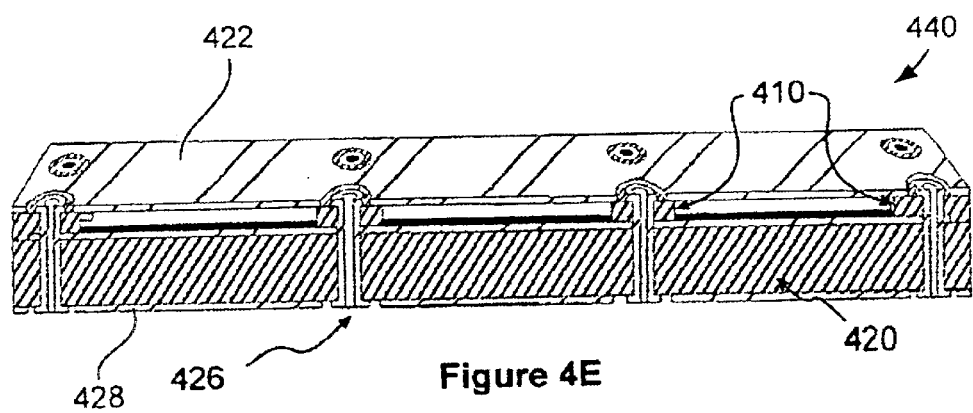

FIG. 4A shows a perspective view of a back plane 400. FIG. 4B shows a close-up view of a portion of back plane 400. FIG. 4C shows a perspective view that illustrates back plane 400. FIG. 4D shows a perspective view that illustrates an alternate embodiment of a back plane 440. FIG. 4E shows a cross-sectional perspective view that illustrates the alternate embodiment of back plane 440.

As shown in FIGS. 4A–4C, back plane 400 includes a dielectric support 410 that has a number of openings 412 which are arranged in rows and columns. In addition, back plane 400 also includes a number of conductors 414 that are formed on dielectric support 410 such that each conductor 414 is formed over each opening 412 In a row of openings. In the example shown in FIGS. 4A–4C, to conductors 414 are formed over each opening 412 in a row of openings (except for the first and last rows of openings 412 along the edge). In addition, each conductor 414 includes a number of contact regions 416 which are formed so that a contact region 416 is formed at each end of each opening 412.

In the example shown in FIGS. 4A–4C, the width of an opening 412 is a function of the size of contact regions 416. The length of opening 412 is as long as possible, limited by the need to maintain the structural integrity of the conductors 414 without gravity induced deformation or sag, and the tensile strength and other requirements of back plane 400.

(The length of opening 412 can alternately be shorter than the longest possible length.)

Referring to FIG. 4C, back plane 400 also includes a layer of insulation material 420 that is formed on conductors 414, and a first metal shield 422 formed on insulation material 420. In one embodiment, as shown in FIG. 4C, insulation material 420 can have openings 424 such that insulation material 420 only occasionally contacts conductors 414, or openings such that insulation material 420 does not contact conductors 414.

In an alternate embodiment of a backplane 440, as shown in FIGS. 4D and 4E, insulation material 420 is formed as a solid element with no openings, other than for conductive plugs 426 as shown in FIG. 4E. Conductive plugs 426 are similar to plugs CP described above in reference to FIGS. 1C–1E. FIGS. 4D and 4E also show a second metal shield 428 that contacts dielectric support 410 (the embodiment 400 shown in FIG. 4C also has a second metal shield). In addition, back planes 400 and 440 can be utilized alone, or can be incorporated into a larger back plane.

FIG. 5 shows a plan view that illustrates a curved section of an air dielectric transmission system 500 in accordance with the present invention. As shown in FIG. 5, system 500 includes a dielectric support 510 with a plurality of openings 512 formed through support 510, and a number of conductors 514 that are connected to support 510. As further shown in FIG. 5, in a curve, the spacing between openings 512 varies from being small on the outside edge of the turn, to large on the inside edge of the turn.

By increasing the size of the spacing between openings 512, the delay is increased slightly on the inside edge of the turn. By slightly increasing the delay on the inside edge of the turn, the signals remain in phase regardless of whether the signals take conductors 514 along the outside or Inside edge of the turn. In addition, the present invention applies to single-wire high speed applications as well as multi-wire applications.

FIG. 6 shows a plan view that illustrates a printed circuit board 600 in accordance with the present invention. As shown in FIG. 6, board 600 includes a number of devices 610 that are formed on circuit board 600, and an air dielectric transmission system 612 that is formed on circuit board 600. In addition such a structure can be formed away from the circuit board and mounted onto the circuit board as a component. Thus, the present invention can be used to route high speed signals from one point on a circuit board to another point on a circuit board. In addition to a circuit board level transmission system, the present invention also applies to larger cabling systems, such as telephone pole to house cables.

FIGS. 7A–7B show cross-sectional views that illustrate an example of a connector 700 in accordance with the present invention. As shown in FIGS. 7A–7B, connector 700 can be utilized with air dielectric transmission structure 320. As shown in FIGS. 7A–7B, connector 700 includes a base member 710, and a conductive ring 712 that is connected to base member 710. Base member 710 includes a first conductive path 714 that is connected to conductive ring 712, and a second conductive path 716.

As further shown in FIGS. 7A–7B, connector 700 includes a biasing member 720, such as a spring, and a conductive plug 722 that fits within conductive ring 712 and is biased away from base member 710 by biasing member 720. In addition, conductive plug 722 is connected to second conductive path 716. As shown in FIG. 7B, when held in place, biasing member 720 insures contact between conductive plug 722 and a conductor CD.

Thus, an air dielectric transmission structure and a method of forming the structure have been disclosed. The present method produces low loss and low dielectric constant structures suitable for use in high-speed electronic signal transmission interconnection structures using common materials and processes.

Moreover, the contact of the polymer with the conductors effectively minimizes tangential signal loss. In the present invention, the signals are transmitted on parallel lines intermittently supported by polymers and shielded on top and bottom with metal reference planes. This allows for low cost materials to be used in the construction without sacrificing performance. The resulting structures will be not only offer the highest levels of electronic performance, but will also be capable of production at a highly favorable cost.

It should be understood that various alternatives to the method of the invention described herein may be employed in practicing the invention. Thus, it is intended that the following claims define the scope of the invention and that methods and structures within the scope of these claims and their equivalents be covered thereby.

What is claimed is:

1. A system for concurrent transmission of multiple electrical signals, the system comprising:
   a signal conducting structure, the structure having:
      a first dielectric support having a number of spaced-apart first openings;
      a first plurality of conductors that contact the first dielectric support such that each conductor is disposed across each first opening in the first dielectric support, individual conductors of the first plurality of conductors being electrically isolated from one another to enable transmission of distinct signals thereon; and
      a second dielectric support that contacts the first plurality of conductors.

2. The system of claim 1 wherein the second dielectric support has a number of spaced-apart second openings such that each of the first plurality of conductors is disposed across each second opening.

3. The system of claim 2 wherein the first openings and the second openings are aligned.

4. The system of claim 2 wherein the first openings and the second openings are offset.

5. The system of claim 2 wherein the conductors of the first plurality of conductors are arranged in parallel.

6. The system of claim 5 and further comprising:
   a first metal shield that contacts the first dielectric support, the first metal shield being spaced apart from the first plurality of conductors by the thickness of the first dielectric support; and
   a second metal shield that contacts the second dielectric support, the second metal shield being spaced apart from the first plurality of conductors by the thickness of the second dielectric support.

7. The system of claim 6 wherein
   the first metal shield has a first contact opening;
   the first dielectric support has a second contact opening, the first and second contact openings exposing a first conductor of the first plurality of conductors.

8. The system of claim 7 and further comprising a contact disposed within the first and second openings to make contact with the first conductor, the contact being electrically isolated from the first metal shield.

9. The system of claim 8 and further comprising a contact element extending through the first and second contact openings to make electrical contact with the first conductor, the contact element being electrically isolated from the first metal shield.

10. The system of claim 7 wherein
the second metal shield has a third contact opening;
the second dielectric support has a fourth contact opening, the third and fourth contact openings exposing the first conductor.

11. The system of claim 2 wherein a first line of first openings has a first spacing there between, a second line of first openings has a second spacing there between, and the first spacing is smaller than the second spacing.

12. The system of claim 2 wherein the first dielectric support further has a number of spaced-apart third openings.

13. The system of claim 12 wherein the signal conducting structure further comprises a second plurality of conductors that contact the first dielectric support and are each disposed across each third opening.

14. The system of claim 13 wherein each conductor of the second plurality of conductors includes a plurality of contact regions, a respective one of the plurality of contact regions being disposed at the end of each third opening.

15. The system of claim 1 further comprising:
a connector element removably coupled to the signal conducting structure, the connector element having:
a base member having a first electrical path and a second electrical path;
a conductive ring connected to the base member and the first electrical path;
a biasing member; and
a conductive plug disposed within the conductive ring and coupled to the second electrical path, the conductive plug being biased away from the base member and toward at least one conductor of the first plurality of conductors by the biasing member such that the conductive plug contacts the at least one conductor.

16. The system of claim 15 wherein the signal conducting structure further comprises a metal shield disposed adjacent the first dielectric support opposite the first plurality of conductors, the conductive ring of the connector element contacting the metal shield when the connector element is coupled to the signal conducting structure.

17. The system of claim 1 wherein the first dielectric support includes a polymer.

18. The system of claim 1 further comprising:
a first metal shield that contacts the first dielectric support, the first metal shield being spaced apart from the first plurality of conductors by the thickness of the first dielectric support;
a third dielectric support that contacts the first metal shield, the third dielectric support having a number of spaced-apart openings;
a second plurality of conductors that contact the third dielectric support such that each of the second plurality of conductors is disposed across each opening of the third dielectric support; and
a fourth dielectric support that contacts the second plurality of conductors on a side opposite the third dielectric support.

19. A method of forming a transmission structure, the method comprising:
laminating a first dielectric support to a first shield and a layer of conductive material, the first dielectric support having a number of spaced-apart first openings; and
selectively removing the layer of conductive material to form a plurality of conductors on the first dielectric support over the first openings, individual conductors of the plurality of conductors being electrically isolated from one another to enable transmission of distinct signals thereon.

20. The method of claim 19 and further comprising:
forming an opening in the first shield and the first dielectric support to expose a first conductor of the plurality of conductors;
forming a contact in the opening to make an electrical connection with the first conductor; and
isolating the contact from the first shield.

21. The method of claim 19 and further comprising:
laminating a second dielectric support to the plurality of conductors, the second dielectric support having a plurality of spaced-apart second openings; and
laminating a second shield to the second dielectric support.

22. A structure for concurrently conducting a plurality of electrical signals, the structure comprising:
a first layer of dielectric material having spaced-apart openings;
a second layer of dielectric material; and
a first plurality of conductors disposed between the first and second layers of dielectric material and extending across the openings, individual conductors of the first plurality of conductors being electrically isolated from one another to enable conduction of distinct signals thereon, and wherein each conductor of the first plurality of conductors extends across each of the openings.

23. The structure of claim 22 wherein each of the openings extends lengthwise in a direction transverse to the first plurality of conductors.

24. A structure for concurrently conducting a plurality of electrical signals, the structure comprising:
a first layer of dielectric material having spaced-apart openings;
a second layer of dielectric material; and
a first plurality of conductors disposed between the first and second layers of dielectric material and extending across the openings, individual conductors of the first plurality of conductors being electrically isolated from one another to enable conduction of distinct signals thereon, and wherein the first plurality of conductors and the first and second dielectric layers each extend lengthwise in a first direction, turn, and extend lengthwise in a second direction from the turn.

25. The structure of claim 24 wherein a first conductor of the first plurality of conductors is disposed adjacent an inside edge of the turn and a second conductor of the first plurality of conductors is disposed adjacent an outside edge of the turn, and wherein the openings are narrower in a region of the first layer of dielectric material traversed by the first conductor than in a region of the first layer of dielectric material traversed by the second conductor.

26. A structure for concurrently conducting a plurality of electrical signals, the structure comprising:
a first layer of dielectric material having spaced-apart openings;
a second layer of dielectric material;
a first plurality of conductors disposed between the first and second layers of dielectric material and extending across the openings, individual conductors of the first plurality of conductors being electrically isolated from one another to enable conduction of distinct signals thereon, and wherein the first layer of dielectric material additionally has contact openings, each contact opening exposing an end of a respective conductor of the first plurality of conductors; and a plurality of connector plugs each disposed within a respective one of the contact openings and making an electrical connection with a respective conductor of the first plurality of conductors.

27. The structure of claims 26 wherein at least one of the connector plugs comprises a plated through hole.

28. A structure for concurrently conducting a plurality of electrical signals, the structure comprising:
   a first layer of dielectric material having spaced-apart openings;
   a second layer of dielectric material;
   a first plurality of conductors disposed between the first and second layers of dielectric material and extending across the openings, individual conductors of the first plurality of conductors being electrically isolated from one another to enable conduction of distinct signals thereon;
   a first metal shield disposed adjacent the first layer of dielectric material opposite the first plurality of conductors;
   a third layer of dielectric material disposed adjacent the first metal shield opposite the first layer of dielectric material; and
   a second plurality of conductors disposed adjacent the third layer of dielectric material opposite the first metal shield.

29. The structure of claim 28 wherein the third layer of dielectric material has spaced-apart openings and wherein the second plurality of conductors extends across the openings in the third layer of dielectric material.

30. The structure of claim 29 further comprising a fourth layer of dielectric material disposed adjacent the second plurality of conductors opposite the third layer of dielectric material.

31. The structure of claim 30 wherein the second layer and fourth layer of dielectric material each have spaced-apart openings and wherein the first plurality of conductors extends across the openings in the second layer of dielectric material, and wherein the second plurality of conductors extends across the openings in the fourth layer of dielectric material.

32. The structure of claim 28 wherein each conductor of the first plurality of conductors is substantially equidistant, along the length thereof, from at least one other conductor of the first plurality of conductors.

33. The structure of claim 28 wherein the openings are arranged in rows and columns and wherein each row of openings is disposed along the length of a respective one of the first plurality of conductors.

34. The structure of claim 28 wherein the first layer of dielectric material additionally has contact openings, each contact opening exposing an end of a respective conductor of the first plurality of conductors.

35. The structure of claim 28 wherein each of the openings is spaced-apart from at least one other of the openings by a first distance.

36. The structure of claim 28 wherein the second layer of dielectric material has spaced-apart openings and wherein the first plurality of conductors extends across the openings in the second layer of dielectric material.

37. The structure of claim 36 wherein the openings in the second layer of dielectric material are substantially aligned with the openings in the first layer of dielectric material.

38. A structure for concurrently conducting a plurality of electrical signals, the structure comprising:
   a first layer of dielectric material having spaced-apart openings;
   a second layer of dielectric material; and
   a first plurality of conductors disposed between the first and second layers of dielectric material and extending across the openings, individual conductors of the first plurality of conductors being electrically isolated from one another to enable conduction of distinct signals thereon, and wherein the second layer of dielectric material has spaced-apart openings, and wherein the first plurality of conductors extends across the openings in the second layer of dielectric material, and wherein the openings in the second layer of dielectric material are offset from the openings in the first layer of dielectric material.

39. A structure for concurrently conducting a plurality of electrical signals, the structure comprising:
   a first layer of dielectric material having spaced-apart openings;
   a second layer of dielectric material; and
   a first plurality of conductors disposed between the first and second layers of dielectric material and extending across the openings, individual conductors of the first plurality of conductors being electrically isolated from one another to enable conduction of distinct signals thereon, and wherein at least one conductor of the first plurality of conductors is narrower at regions of the at least one conductor that contact the first layer of dielectric material than at regions of the at least one conductor that extend across the openings.

* * * * *